(12) United States Patent
Koo et al.

(10) Patent No.: US 9,543,951 B2
(45) Date of Patent: Jan. 10, 2017

(54) SEMICONDUCTOR APPARATUS

(71) Applicant: SK hynix Inc., Icheon-si Gyeonggi-do (KR)

(72) Inventors: Ja Beom Koo, Icheon-si (KR); Jeong Tae Hwang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/847,653

(22) Filed: Sep. 8, 2015

(65) Prior Publication Data

US 2016/0308532 A1   Oct. 20, 2016

(30) Foreign Application Priority Data

Apr. 14, 2015 (KR) .................. 10-2015-0052219

(51) Int. Cl.
| | | |
|---|---|---|
| *G05F 1/10* | (2006.01) | |
| *G11C 7/00* | (2006.01) | |
| *H03L 5/00* | (2006.01) | |
| *H03K 19/0175* | (2006.01) | |
| *G11C 13/00* | (2006.01) | |
| *G11C 11/22* | (2006.01) | |

(52) U.S. Cl.
CPC ... *H03K 19/017509* (2013.01); *G11C 13/0038* (2013.01); *G11C 11/2297* (2013.01)

(58) Field of Classification Search
CPC .............. G11C 29/028; G11C 29/021; G01R 31/31703; G01R 31/03004
USPC ....... 327/525, 530, 544, 328, 540, 541, 333; 365/189.09, 185.17, 226, 200, 201
See application file for complete search history.

(56) References Cited

U.S. PATENT DOCUMENTS

| | | | | |
|---|---|---|---|---|
| 7,539,072 B2* | 5/2009 | Kang | ................ | G11C 5/14 365/189.07 |
| 7,706,200 B2* | 4/2010 | Chi | ................ | G11C 5/14 365/189.09 |
| 7,779,317 B2* | 8/2010 | Kim | ................ | G01R 31/31724 327/334 |
| 8,280,672 B2* | 10/2012 | Kim | ................ | G11C 17/18 327/525 |

FOREIGN PATENT DOCUMENTS

| | | |
|---|---|---|
| KR | 1019900015142 A | 10/1990 |
| KR | 2019970025142 Y1 | 6/1997 |

* cited by examiner

*Primary Examiner* — Dinh T Le
(74) *Attorney, Agent, or Firm* — William Park & Associates Ltd.

(57) ABSTRACT

A semiconductor apparatus may include an internal voltage level controller configured to output either a normal trimming code or a test voltage code as a voltage control code in response to a test mode signal, a specific operation start signal, and a specific operation end signal. The semiconductor apparatus may include an internal voltage generator configured to generate an internal voltage and control a voltage level of the internal voltage in response to the voltage control code.

9 Claims, 3 Drawing Sheets

SEMICONDUCTOR APPARATUS

CROSS-REFERENCES TO RELATED APPLICATION

This application claims priority under 35 U.S.C. 119(a) to Korean application No. 10-2015-0052219, filed on Apr. 14, 2015, in the Korean intellectual property Office, which is incorporated by reference in its entirety as set forth in full.

BACKGROUND

1. Technical Field

Various embodiments generally relate to a semiconductor integrated circuit, and more particularly, to a semiconductor apparatus.

2. Related Art

A semiconductor apparatus receives voltages from outside the semiconductor apparatus itself. With these received voltages the semiconductor apparatus generates voltages inside itself at required voltage levels. The voltages applied from the outside of the semiconductor apparatus are called external voltages, and the voltages generated in the inside of the semiconductor apparatus are called internal voltages.

In general, since the voltage level of the internal voltage is determined by a trimming code, when the trimming code is not changed, the voltage level of the internal voltage is also not changed.

A test on the semiconductor apparatuses may be performed to determine whether or not the semiconductor apparatuses are defective. When it is necessary to vary the voltage level of the internal voltage in a specific operation according to the kind of test, it is difficult to vary the voltage level of the internal voltage in circumstances where the code value of the trimming code is fixed using a fuse circuit.

SUMMARY

According to an embodiment, there may be provided a semiconductor apparatus. The semiconductor apparatus may include an internal voltage level controller configured to output either a normal trimming code or a test voltage code as a voltage control code in response to a test mode signal, a specific operation start signal, and a specific operation end signal. The semiconductor apparatus may include an internal voltage generator configured to generate an internal voltage and control a voltage level of the internal voltage in response to the voltage control code.

According to an embodiment, there may be provided a semiconductor apparatus. The semiconductor apparatus may include an internal voltage level controller configured to output a test voltage code as a voltage control code only in an active period while in a test and output a normal trimming code as the voltage control code while in a non-test or in a period other than the active period while in the test. The semiconductor apparatus may include an internal voltage generator configured to generate an internal voltage having a voltage level corresponding to a code value of the voltage control code.

DETAILED DESCRIPTION

Figure 1:
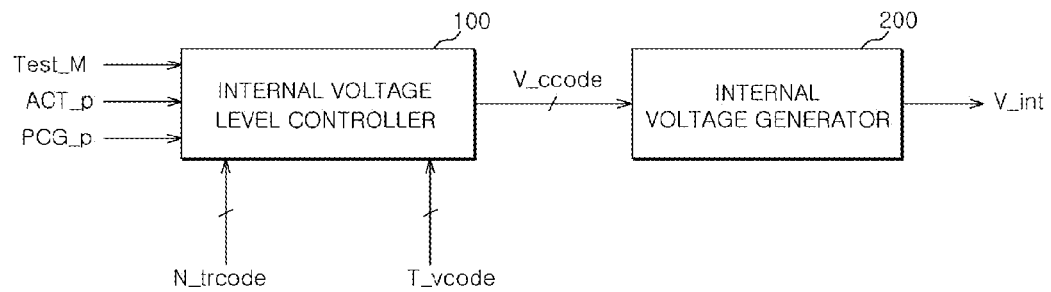
FIG. 1 is a view illustrating a representation of an example of a configuration of a semiconductor apparatus according to an embodiment.

Hereinafter, various examples of embodiments will be described below with reference to the accompanying drawings. Examples of the embodiments are described herein with reference to cross-sectional illustrations that are schematic illustrations of examples of the embodiments (and intermediate structures). As such, variations from the shapes of the illustrations as a result, for example, of manufacturing techniques and/or tolerances, are to be expected. Thus, the examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The various embodiments are described herein with reference to cross-section and/or plan illustrations that are schematic illustrations of representations of examples of the embodiments. However, embodiments of the description should not be limited even though a few representations of the embodiments are illustrated and described. It will be appreciated by those of ordinary skill in the art that changes may be made in these examples of the embodiments without departing from the principles and spirit of the description.

Referring to FIG. 1, a semiconductor apparatus according to an embodiment may include an internal voltage level controller 100, and an internal voltage generator 200.

The internal voltage level controller 100 may output one of either a normal trimming code N_trcode or a test voltage code T_vcode as a voltage control code V_ccode. The voltage control code V_ccode may be output by the internal voltage level controller 100 in response to a test mode signal Test_M, a specific operation start signal ACT_p, and a specific operation end signal PCG_p. For example, the internal voltage level controller 100 may output the test voltage code T_vcode as the voltage control code V_ccode until the specific operation end signal PCG_p is enabled after the specific operation start signal ACT_p is enabled while the test mode signal Test_M is in an enabled state, and may output the normal trimming code N_trcode as the voltage control code V_ccode when the test mode signal Test_M is disabled or when the specific operation start signal ACT_p is disabled while the test mode signal Test_M is in an enabled state.

The internal voltage generator 200 may generate an internal voltage V_int and may control a voltage level of the internal voltage V_int in response to the voltage control code V_ccode. The internal voltage generator 200 may generate the internal voltage V_int having a voltage level corresponding to the code value of the voltage control code V_ccode.

Figure 2:
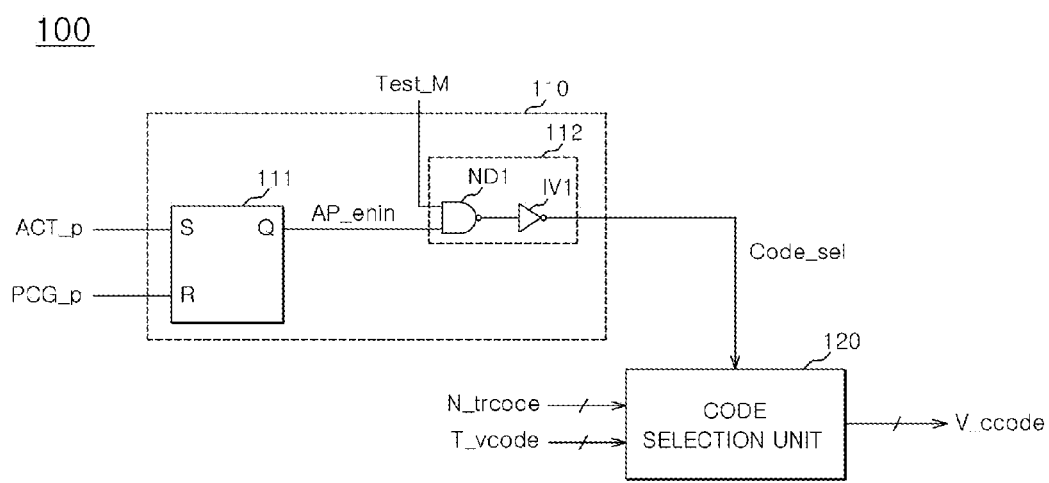
FIG. 2 is a view illustrating a representation of an example of a configuration of an internal voltage level controller of FIG. 1.

Referring to FIG. 2, the internal voltage level controller 100 may include a code selection signal generation unit 110 and a code selection unit 120.

The code selection signal generation unit 110 may generate a code selection signal Code_sel. The code selection signal Code_sel may be generated by the code selection signal generation unit 110 in response to the test mode signal Test_M, the specific operation start signal ACT_p, and the specific operation end signal PCG_p. For example, the code selection signal generation unit 110 enables the code selection signal Code_sel until the specific operation end signal PCG_p is enabled after the specific operation start signal ACT_p is enabled while the test mode signal Test_M is in an enabled state. The code selection signal generation unit 110 disables the code selection signal Code_sel when the test mode signal Test_M is disabled or the specific operation start signal ACT_p is disabled.

The code selection signal generation unit 110 may include a latch unit 111, and a code selection signal output unit 112.

The latch unit 111 may enable a specific operation enable period signal AP_enin when the specific operation start signal ACT_p is enabled. The latch unit 111 may disable the specific operation enable period signal AP_enin when the specific operation end signal PCG_p is enabled. For example, the latch unit 111 enables the specific operation enable period signal AP_enin until the specific operation end signal PCG_p is enabled after the specific operation start signal ACT_p is enabled. The latch unit 111 may be implemented with, for example but not limited to, a SR latch circuit.

The code selection signal output unit 112 may enable the code selection signal Code_sel when the test mode signal Test_M is enabled and the specific operation enable period signal AP_enin is enabled. The code selection signal output unit 112 may disable the code selection signal Code_sel when the test mode signal Test_M is disabled or when the specific operation enable period signal AP_enin is disabled. For example, the code selection signal output unit 112 outputs the specific operation enable period signal AP_enin as the code selection signal Code_sel when the test mode signal Test_M is enabled, and disables the code selection signal Code_sel when the test mode signal Test_M is disabled.

The code selection signal output unit 112 may include logic gates. For example, the code selection signal output unit 112 may include a NAND gate ND1 and an inverter IV1. The NAND gate ND1 may receive the test mode signal Test_M and the specific operation enable period signal AP_enin. The inverter IV1 may receive an output signal of the NAND gate ND1 and may output the code selection signal Code_sel.

The code selection unit 120 may output one of either the normal trimming code N_trcode or the test voltage code T_vcode as the voltage control code V_ccode in response to the code selection signal Code_sel. For example, the code selection unit 120 outputs the test voltage code T_vcode as the voltage control code V_ccode when the code selection signal Code_sel is enabled, and outputs the normal trimming code N_trcode as the voltage control code V_ccode when the code selection signal Code_sel is disabled.

An example of an operation of a semiconductor apparatus including an above-described configuration according to an embodiment will be described.

Referring to FIGS. 1 and 2, the internal voltage level controller 100 may include the code selection signal generation unit 110 and the code selection unit 120. The code selection signal generation unit 110 may include the latch unit 111 and the code selection signal output unit 112.

The latch unit 111 may enable the specific operation enable period signal AP_enin when the specific operation start signal ACT_p is enabled. The latch unit 111 may disable the specific operation enable period signal AP_enin when the specific operation end signal PCG_p is enabled. For example, the latch unit 111 enables the specific operation enable period signal AP_enin until the specific operation end signal PCG_p is enabled after the specific operation start signal ACT_p is enabled.

The code selection signal output unit 112 may disable the code selection signal Code_sel when the test mode signal Test_M is disabled or when the specific operation enable period signal AP_enin is disabled. The code selection signal output unit 112 may enable the code selection signal Code_sel when the test mode signal Test_M is enabled and the specific operation enable period signal AP_enin is enabled.

The code selection signal generation unit 110 may enable the code selection signal Code_sel when the specific operation start signal ACT_p is enabled while the test mode signal Test_M is in an enabled state, and may maintain the enabled code selection signal Code_sel until the specific operation end signal PCG_p is enabled. The code selection signal generation unit 110 may disable the code selection signal Code_sel when the test mode signal Test_M is disabled or when the specific operation start signal ACT_p is disabled.

The code selection unit 120 may output the test voltage code T_vcode as the voltage control code V_ccode when the code selection signal Code_sel is enabled. The code selection unit 120 may output the normal trimming code N_trcode as the voltage control code V_ccode when the code selection signal Code_sel is disabled.

The internal voltage level controller 100 outputs the test voltage code T_vcode as the voltage control code V_ccode until the specific operation end signal PCG_p is enabled after the specific operation start signal ACT_p is enabled while the test mode signal Test_M is in an enabled state. The internal voltage level controller 100 may output the normal trimming code N_trcode as the voltage control code V_ccode when the test mode signal Test_M is disabled or the specific operation start signal ACT_p is disabled.

The internal voltage generator 200 may generate the internal voltage V_int having the voltage level corresponding to the code value of the voltage control code V_ccode.

Figure 3:
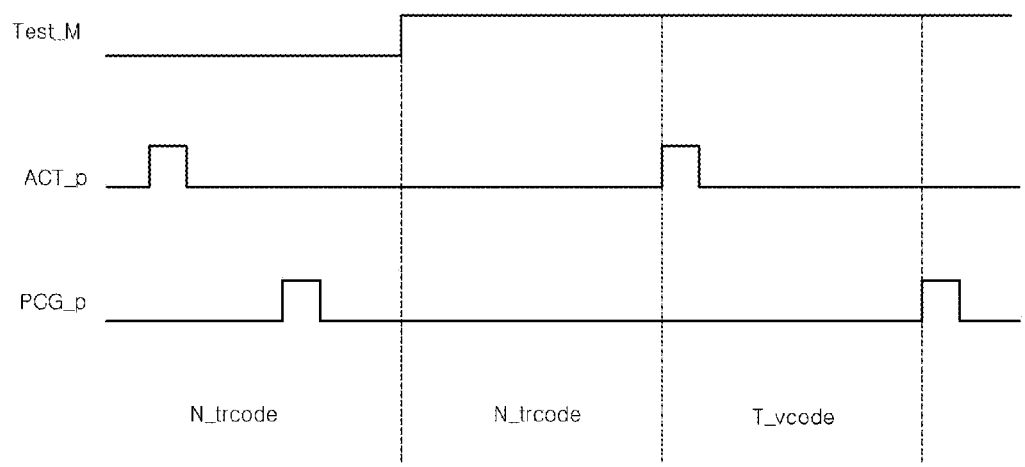
FIG. 3 is a timing chart explaining an a representation of an example of an operation of a semiconductor apparatus according to an embodiment.

Referring to FIG. 3, the semiconductor apparatus according to an embodiment may generate the internal voltage V_int having a voltage level corresponding to a code value of the test voltage code T_vcode only until the specific operation end signal PCG_p is enabled after the specific operation start signal ACT_p is enabled while the test mode signal Test_M is in an enabled state. The semiconductor apparatus according to an embodiment may generate the internal voltage V_int having a voltage level corresponding to a code value of the normal trimming code N_trcode when the test mode signal Test_M is disabled. The semiconductor apparatus according to an embodiment may generate the internal voltage V_int having the voltage level corresponding to the code value of the normal trimming code N_trcode when the specific operation start signal ACT_p is not enabled even while the test mode signal Test_M is in an enabled state.

The semiconductor apparatus according to an embodiment may vary the voltage level of the internal voltage by the test voltage code during a specific operation period in a test, that is, by the signals input in the test. The semiconductor apparatus according to an embodiment may generate the internal voltage having the voltage level corresponding to the code value of the normal trimming code in a period other than the specific operation period in the test and in a non-test.

It may be assumed that the specific operation performed in the test by the semiconductor apparatus according to an embodiment is an active operation. At this time, the specific operation start signal ACT_p may be an active pulse, and the specific operation end signal PCG_p may be a precharge pulse.

The internal voltage level controller 100 of the semiconductor apparatus according to an embodiment may output the test voltage code T_vcode as the voltage control code V_ccode only in the active period in the test, and may output the normal trimming code N_trcode as the voltage control code V_ccode in the non-test or in a period other than the active period in the test. The internal voltage generator 200 may generate the internal voltage V_int having the voltage level corresponding to the code value of the voltage control code V_ccode.

The internal voltage level controller 100 may output the test voltage code T_vcode as the voltage control code V-ccode until the precharge pulse PCG_p is enabled after the active pulse ACT_p is enabled while the test mode signal Test_M is in an enabled state, and may output the normal trimming code N_trcode as the voltage control code V_ccode when the test mode signal Test_M is disabled or when the active pulse ACT_p is disabled.

The latch unit 111 of the internal voltage level controller 100 may enable the specific operation enable period signal AP_enin until the precharge pulse PCG_p is enabled after the active pulse ACT_p is enabled.

The code selection signal output unit 112 of the internal voltage level controller 100 may output the specific operation enable period signal AP_enin as the code selection signal Code_sel when the test mode signal Test_M is enabled, and may disable the code selection signal Code_sel when the test mode signal Test_M is disabled.

The code selection unit 120 of the internal voltage level controller 100 may output the test voltage code T_vcode as the voltage control code V_ccode when the code selection signal Code_sel is enabled, and may output the normal trimming code N_trcode as the voltage control code V_ccode when the code selection signal Code_sel is disabled.

The semiconductor apparatus according to an example of an embodiment has described that the specific operation in the test is limited to the active operation, but the specific operation is not limited to the active operation.

Figure 4:
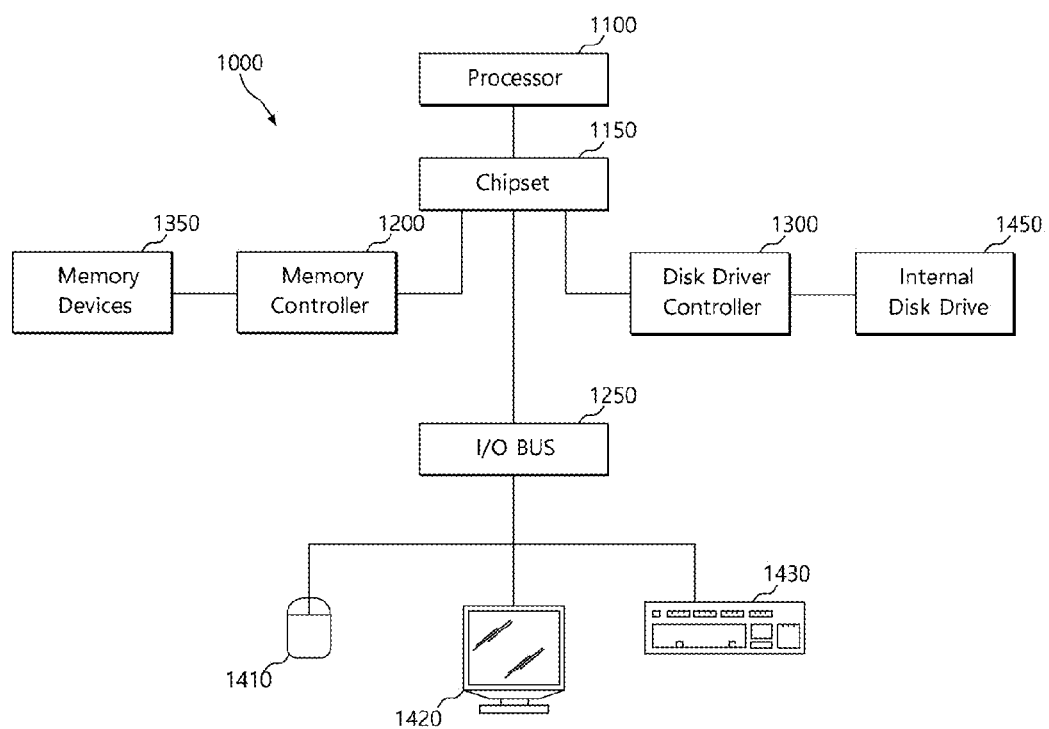
FIG. 4 illustrates a block diagram of an example of a representation of a system employing a semiconductor apparatus and/or internal voltage controller in accordance with the various embodiments discussed above with relation to FIGS. 1-3.

The semiconductor apparatus and/or internal voltage level controller discussed above (see FIGS. 1-3) are particular useful in the design of memory devices, processors, and computer systems. For example, referring to FIG. 4, a block diagram of a system employing a semiconductor apparatus and/or internal voltage level controller in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus and/or internal voltage level controller as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and/or internal voltage level controller as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor apparatus and/or internal voltage level controller as discussed above with relation to FIGS. 1-3. In alternate embodiments, such as, for example but not limited to, cellular phones or digital cameras, the components may differ from the embodiments illustrated in FIG. 4.

The above embodiments are illustrative and not limitative. Various alternatives and equivalents are possible. The description is not limited by the embodiment described herein. Nor is the description limited to any specific type of semiconductor device. Other additions, subtractions, or modifications are obvious in view of the present disclosure and are intended to fall within the scope of the appended claims.

What is claimed is:

1. A semiconductor apparatus comprising:
an internal voltage level controller configured to output either a normal trimming code or a test voltage code as a voltage control code in response to a test mode signal, a specific operation start signal, and a specific operation end signal; and
an internal voltage generator configured to generate an internal voltage in response to the voltage control code,
wherein the specific operation start signal is an active pulse, and the specific operation end signal is a precharge pulse.

2. The semiconductor apparatus of claim 1, wherein the internal voltage level controller outputs the test voltage code as the voltage control code until the specific operation end signal is enabled after the specific operation start signal is enabled while the test mode signal is in an enabled state, and outputs the normal trimming code as the voltage control code when the test mode signal is disabled or when the specific operation start signal is disabled while the test mode signal is in an enabled state.

3. The semiconductor apparatus of claim 1, wherein the internal voltage level controller includes:
a code selection signal generation unit configured to generate a code selection signal in response to the test mode signal, the specific operation start signal, and the specific operation end signal; and
a code selection unit configured to output one of either the normal trimming code or the test voltage code as the voltage control code in response to the code selection signal.

4. The semiconductor apparatus of claim 3,
wherein the code selection unit outputs the test voltage code as the voltage control code when the code selection signal is enabled, and
wherein the code selection unit outputs the normal trimming code as the voltage control code when the code selection signal is disabled.

5. The semiconductor apparatus of claim 3, wherein the code selection signal generation unit enables the code selection signal until the specific operation end signal is enabled after the specific operation start signal is enabled while the test mode signal is in an enabled state.

6. The semiconductor apparatus of claim 5, wherein the code selection signal generation unit includes:
a latch unit configured to enable a specific operation enable period signal when the specific operation start signal is enabled, and disable the specific operation enable period signal when the specific operation end signal is enabled; and
a code selection signal output unit configured to enable the code selection signal when the test mode signal is enabled and the specific operation enable period signal is enabled, and disable the code selection signal when the test mode signal is disabled or when the specific operation enable period signal is disabled.

7. The semiconductor apparatus of claim 6, wherein the code selection signal output unit includes:
a logic gate configured to receive the test mode signal and the specific operation enable period signal; and
an inverter configured to receive an output of the logic gate and output the code selection signal.

8. The semiconductor apparatus of claim 7, wherein the logic gate includes a NAND gate.

9. The semiconductor apparatus of claim 6, wherein the latch unit includes a SR latch circuit.

* * * * *